United States Patent
Porret et al.

(10) Patent No.: US 8,570,202 B2
(45) Date of Patent: Oct. 29, 2013

(54) DIGITAL-TO-ANALOG CONVERTER IMPLEMENTING HYBRID CONVERSION ARCHITECTURE

(75) Inventors: Alain-Serge Porret, Sunnyvale, CA (US); Friederich Mombers, Sunnyvale, CA (US); Melly Thierry, Lausanne (CH)

(73) Assignee: SiGear Europe Sarl, Lausanne (CH)

( * ) Notice: Subject to any disclaimer, the term of this patent is extended or adjusted under 35 U.S.C. 154(b) by 34 days.

(21) Appl. No.: 13/365,883

(22) Filed: Feb. 3, 2012

(65) Prior Publication Data

US 2013/0201045 A1    Aug. 8, 2013

(51) Int. Cl.
*H03M 1/66*    (2006.01)

(52) U.S. Cl.
USPC .......................................... 341/144; 341/145

(58) Field of Classification Search
USPC .................................. 341/144, 145
See application file for complete search history.

(56) References Cited

U.S. PATENT DOCUMENTS

| | | | |
|---|---|---|---|
| 4,814,767 A | 3/1989 | Fernandes et al. | |
| 5,764,172 A * | 6/1998 | Rodal | 341/145 |
| 6,198,419 B1 * | 3/2001 | Wen | 341/145 |
| 6,292,125 B1 | 9/2001 | Conroy | |
| 6,594,309 B1 | 7/2003 | Botti et al. | |
| 6,646,581 B1 | 11/2003 | Huang | |
| 6,650,258 B1 | 11/2003 | Kelly et al. | |
| 7,283,082 B1 * | 10/2007 | Kuyel et al. | 341/155 |
| 8,138,957 B2 * | 3/2012 | Baek et al. | 341/144 |
| 2005/0093729 A1 | 5/2005 | Lin et al. | |
| 2007/0024482 A1 | 2/2007 | Rivoir et al. | |
| 2010/0027711 A1 | 2/2010 | Manku et al. | |
| 2010/0328124 A1 | 12/2010 | O'Donnell et al. | |
| 2011/0169672 A1 | 7/2011 | Deval et al. | |

OTHER PUBLICATIONS

Walt Kester, "Oversampling Interpolating DACs," Analog Devices MT-017 Tutorial, pp. 1-7.
Walt Kester, Analog Devices, MT-017 Tutorial, "Oversampling Interpolating DACs", Rev.A 10/08, Copyright 2009.

* cited by examiner

*Primary Examiner* — Brian Young
(74) *Attorney, Agent, or Firm* — Van Pelt, Yi & James LLP

(57) ABSTRACT

A digital-to-analog converter (DAC) implements a hybrid conversion architecture where the input digital data is oversampled and a flash converter is used to convert the M most significant bits (MSBs) of the oversampled data while a sigma-delta (Σ-Δ) converter is used to convert the remaining least significant bits (LSBs) of the oversampled data. In one embodiment, a merged flash converter is used to convert the M MSBs and the digital bit stream generated by the sigma-delta converter.

23 Claims, 7 Drawing Sheets

DIGITAL-TO-ANALOG CONVERTER IMPLEMENTING HYBRID CONVERSION ARCHITECTURE

FIELD OF THE INVENTION

The invention relates to digital-to-analog converters (DACs) and, in particular, to a digital-to-analog converter implementing hybrid conversion architecture.

DESCRIPTION OF THE RELATED ART

A television (TV) or video recorder includes a television signal receiver (or television receiver) to receive terrestrial broadcast, cable television or satellite broadcast television signals and to process the television signals into the appropriate video and audio signals for display or for recording. Television signals are transmitted in analog or digital formats and in accordance with a variety of standards. For analog television transmission, the NTSC (National Television Standards Committee) standard, the PAL (Phase Alternate Lines) standard, and the SECAM (Sequential Couleur Avec Memoire) standard are widely adopted. On the other hand, for digital television (DTV) transmission, the DVB (Digital Video Broadcast) format, the ATSC (Advanced Television Standards Committee) format and other digital television broadcasting formats are available.

Complex Radio-Frequency (RF) receivers generally benefit from having one part of the processing being executed in the analog domain and the other part being carried out in the digital domain after adequate analog-to-digital conversion. These RF receivers are referred to as mixed-signal receivers and generate digital output signals indicative of the received television signals. However, in many systems, such as most television systems, the interface used between the receiver and the decoder that follows—which is typically housed in a different chip—is an analog interface. In the case of terrestrial, cable or satellite video broadcast signals, the preferred interfaces are Composite Video Baseband Signal (CVBS) and Sound Intermediate Frequency (SIF) for analog transmissions and Zero-IF or Low-IF analog signal for digital transmissions. Therefore, mixed-signal receivers typically need to integrate some means for digital-to-analog (D/A) conversion to convert the digital output signals back to the analog domain for use by the subsequent decoder circuit.

SUMMARY OF THE INVENTION

According to one embodiment of the present invention, a digital-to-analog converter (DAC) circuit receiving an N1-bit digital input data at a first sampling frequency and generating an analog output signal indicative of the digital input data includes a rate converter configured to receive the N1-bit digital input data and to generate an oversampled output data in N2 bits at an oversampled frequency being K times the first sampling frequency; a converter configured to receive the M most significant bits (MSBs) of the oversampled output data and to generate a first analog signal indicative of the M MSBs of the oversampled output data; a sigma-delta converter configured to receive the N2-M least significant bits (LSBs) of the oversampled output data and to generate a second analog signal indicative of the N2-M LSBs of the oversampled output data; a data combiner configured to combine the first and second analog signals and to generate a third analog signal; and an anti-aliasing filter configured to filter the third analog signal to generate a filtered analog output signal as the analog output signal of the DAC circuit.

According to another aspect of the present invention, a digital-to-analog converter (DAC) circuit receiving an N1-bit digital input data at a first sampling frequency and generating an analog output signal indicative of the digital input data includes a rate converter configured to receive the N1-bit digital input data and to generate an oversampled output data in N2 bits at an oversampled frequency being K times the first sampling frequency; a sigma-delta modulator configured to receive the N2-M least significant bits (LSBs) of the oversampled output data and to process the N2-M LSBs into a P-state digital bit stream, P being 2 or more; a data combiner configured to receive and combine the M most significant bits (MSBs) of the oversampled output data and the P-state digital bit stream into a set of combined data bits; a flash converter configured to receive the set of combined data bits and to generate a first analog signal; and an anti-aliasing filter configured to filter the first analog signal to generate a filtered analog output signal as the analog output signal of the DAC circuit.

The present invention is better understood upon consideration of the detailed description below and the accompanying drawings.

DETAILED DESCRIPTION OF THE PREFERRED EMBODIMENTS

In accordance with the principles of the present invention, a digital-to-analog converter (DAC) implements a hybrid conversion architecture where the input digital data is oversampled and a flash converter is used to convert the M most significant bits (MSBs) of the oversampled data while a sigma-delta ($\Sigma$-$\Delta$) converter is used to convert the remaining least significant bits (LSBs) of the oversampled data. By using a hybrid architecture in the DAC of the present invention, the requirement for the anti-aliasing filter in the DAC is greatly relaxed and the same anti-aliasing filter can be used for a wide range of input digital signals having low or high frequencies. Furthermore, the hybrid-architecture DAC enables the use of low-cost slower speed fabrication process to implement the sigma-delta modulator, thereby easing the manufacturing requirements while realizing a high performance DAC.

In embodiments of the present invention, the hybrid-architecture DAC is incorporated in a mixed-signal RF receiver to convert digitally processed RF signals back to the analog domain. When the hybrid-architecture DAC is applied in a mixed signal RF receiver, such as a television receiver, the same DAC can be used for all types of television signals, including low-frequency analog television signals and high-frequency satellite signals. Furthermore, the hybrid-architecture DAC makes easier the filtering of clock spurs in the output signal, thereby improving the signal quality.

RF Receiver Architecture

Figure 1:
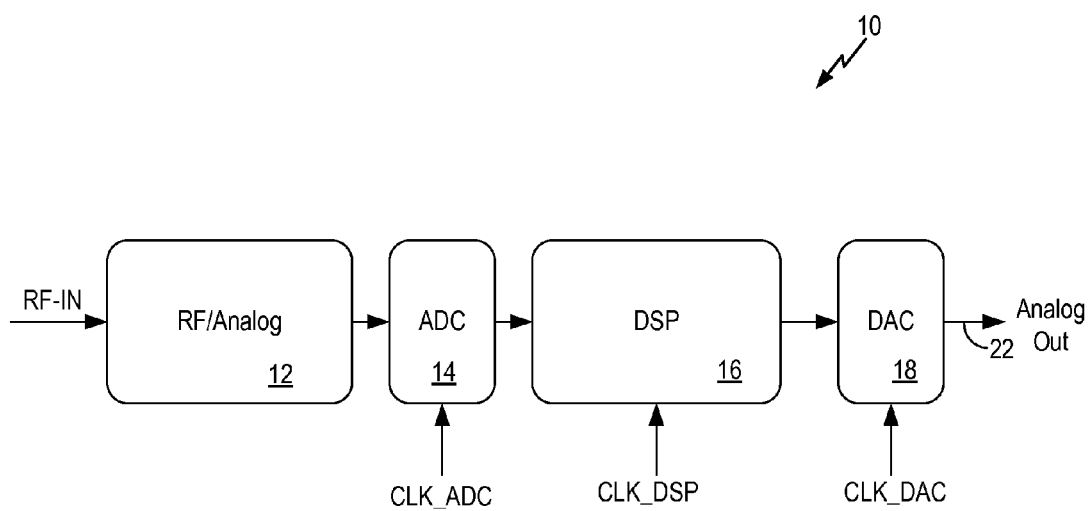
FIG. 1 is a schematic diagram illustrating the general architecture of a mixed-signal RF receiver in which the hybrid-architecture DAC can be incorporated in embodiments of the present invention.

FIG. 1 is a schematic diagram illustrating the general architecture of a mixed-signal RF receiver in which the hybrid-architecture DAC can be incorporated in embodiments of the present invention. Referring to FIG. 1, a mixed-signal RF receiver 10 includes an RF/Analog front-end circuit 12 that receives an incoming RF input signal (RF-IN), selects a channel from the incoming analog RF signal and converts the selected channel signal to a low intermediate frequency (IF) signal. The IF signal is then digitized by an analog-to-digital converter (ADC) 14 at a given ADC sampling rate determined by the ADC clock (CLK_ADC). The digitized IF signal is then processed entirely in the digital domain by a digital signal processing (DSP) circuit 16 clocked at a DSP clock rate defined by a DSP clock signal (CLK_DSP) and operating at a native DSP sampling frequency. After digital processing, the received information is provided to a digital-to-analog converter (DAC) 18 to be converted back to the analog domain to generate analog signals as the processed output signals on an output node 22. The DAC 18 converts the digital signals back to analog signals at a sampling rate determined by a DAC clock signal (CLK_DAC). The analog output signal may then be provided to the subsequent circuitry, such as a decoder, which requires an analog input signal. The decoder typically includes an analog-to-digital converter (ADC) at the input stage to digitize the analog input signal for subsequent processing or decoding in the digital domain.

Traditional DAC Architecture

A variety of schemes for digital-to-analog conversion have been developed. In applications requiring high signal resolution or high signal definition, fast DACs operating at multi-mega-Hertz frequencies and up to 10 to 12 bits are commonly used. Alternately, a binary-weighted approach or a hybrid approach using part thermometer-coded and part binary-weighted has also been commonly used. However, these common DAC schemes have various drawbacks. First, in order to reach a high accuracy (such as >8 bits), the silicon area required to implement the DAC is typically large and does not necessarily scale down well with denser process nodes. Second, if the signal bandwidth is relatively close to the Nyquist frequency (being half of the sampling frequency), the frequency response is not flat and the output signal includes aliased replica around the multiples of the sampling frequency. Third, due to various imperfections, clock spurs at multiples of the sampling frequency tend to leak into the output signal spectrum.

In many applications, the analog output signal generated by a DAC is coupled to the input of an ADC to be digitized for subsequent processing. The ADC may be running at an unknown sampling frequency different from the sampling rate of the DAC. If no precautions are taken, the analog-to-digital conversion process will fold the replica and the clock leakage components into the signal spectrum, potentially impairing the received signal. In order to avoid this effect, a filter, referred to as an anti-aliasing filter, must be interposed between the DAC and the subsequent ADC. In order to prevent any significant degradation of the resolution of the DAC, the anti-aliasing filter must attenuate the out-of-band spectrum components by a significant amount, such as 60 dB or more. Such an analog filter can be difficult to realize in practice, especially if the useful signal bandwidth is relatively close to the Nyquist frequency and a very steep transition from pass-band to cut-band might therefore be required.

The anti-aliasing filter can be realized with discrete components and it may be implemented off-chip or integrated with the receiver or the decoder. An integrated filter is preferred in practice but adds complexity to the design and power consumption of the receiver integrated circuit. Integrated or not, the anti-aliasing filter adds cost to the DAC implementation.

Figure 2:
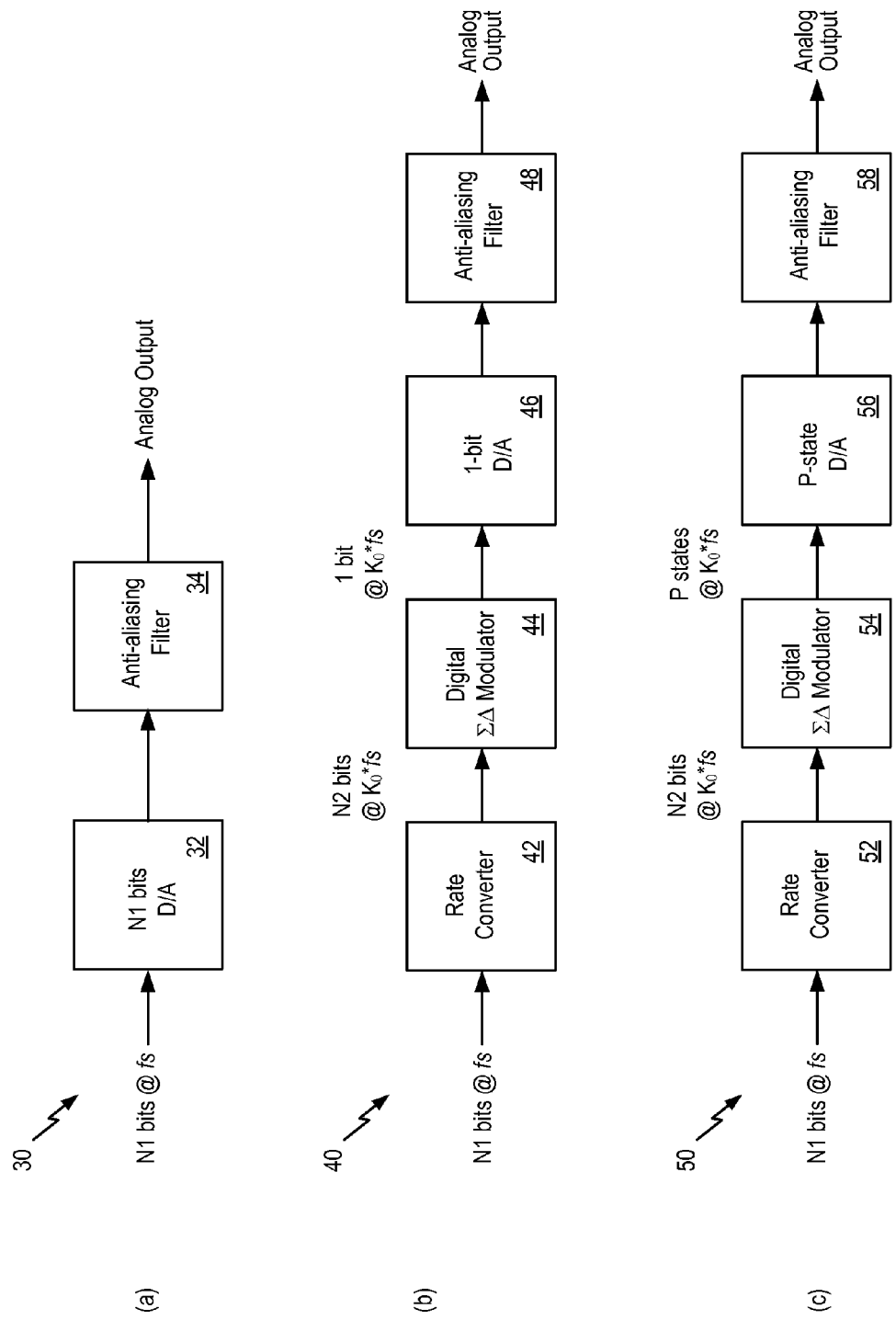
FIG. 2(a) illustrates a conventional Nyquist-rate data converter for converting a digital signal in N1 bits to an analog output signal.
FIG. 2(b) illustrates a conventional single-bit sigma-delta DAC.
FIG. 2(c) illustrates a conventional multi-bit sigma-delta DAC.

FIG. 2(a) illustrates a conventional Nyquist-rate data converter for converting a digital signal in N1 bits to an analog output signal. Referring to FIG. 2(a), a Nyquist-rate data converter 30 includes a DAC 32 and an anti-aliasing filter 34. The DAC 32 receives a digital input signal in N1 bits at a frequency of fs. The DAC 32 converts the digital input signal in N1 bits to an analog signal and provides the analog signal to the anti-aliasing filter 34 for filtering. The filtered output signal of the anti-aliasing filter 34 is the final analog output signal of the Nyquist-rate data converter 30.

Figure 3:
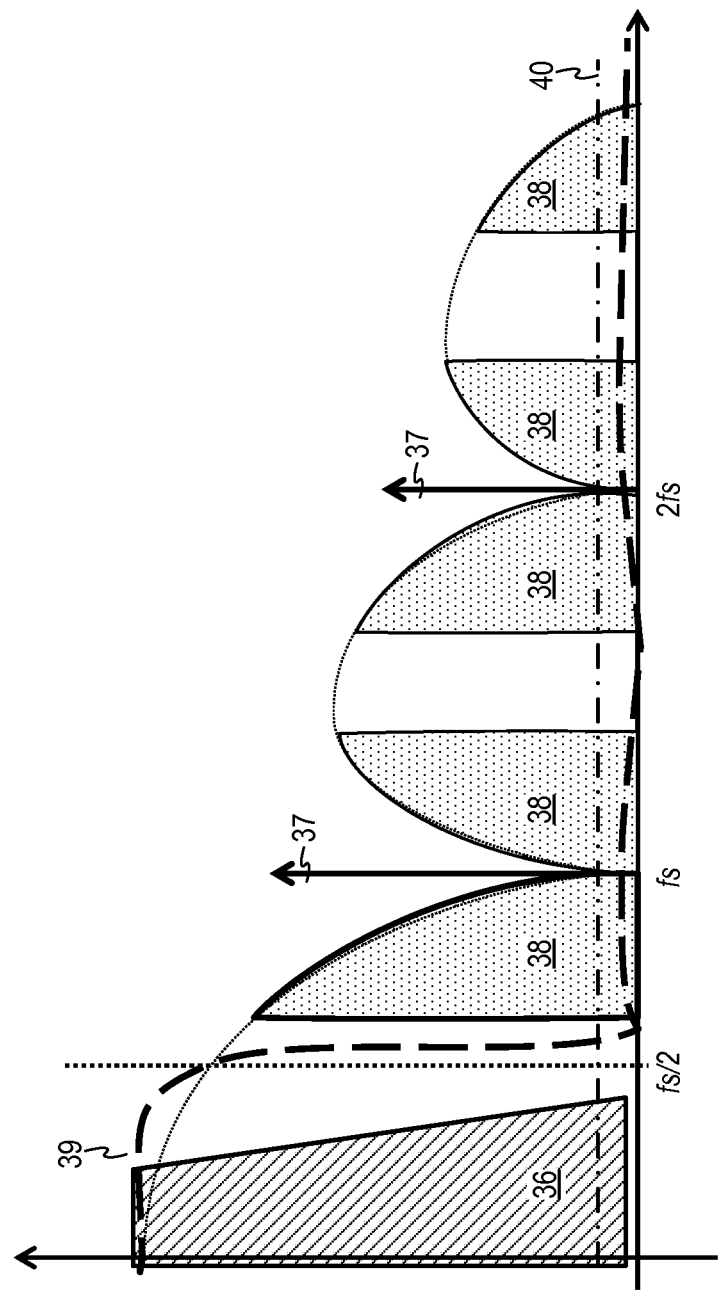
FIG. 3 illustrates the frequency spectrum of the unfiltered DAC output signal for the data converter of FIG. 2(a).

FIG. 3 illustrates the frequency spectrum of the unfiltered DAC output signal for the data converter of FIG. 2(a). The frequency response has a $\sin(x)/x$ roll off and images or replica 38 of the fundamental signal 36 occur as a result of the sampling function. With the DAC sampling frequency denoted as fs, clock spurs occur at multiples of the DAC sampling frequencies due to clock leakage, such as the clock spurs 37 at fs and 2fs. Curve 40 denotes the quantization noise. These undesirable signal artifacts can greatly degrade the analog output signal of the data converter and the anti-aliasing filter 34 of the data converter 30 (FIG. 2(a)) must be capable of filtering out all of the image signals and clock spurs. However, when the useful signal bandwidth represented by the fundamental signal 36 is close to the Nyquist frequency, being one-half of the DAC sampling frequency (fs/2), the anti-aliasing filter 34 must realize a very steep transition from pass-band to cut-band, as shown by curve 39 in FIG. 3. An anti-aliasing filter having such a steep transition is typically very complex and thus difficult and costly to implement in practice.

Alternatives to the Nyquist-rate data converter include sigma-delta ($\Sigma$-$\Delta$) DACs implementing noise shaping techniques. FIG. 2(b) illustrates a conventional single-bit sigma-delta DAC and FIG. 2(c) illustrates a conventional multi-bit sigma-delta DAC. Referring first to FIG. 2(b), a single-bit sigma-delta DAC 40 includes a rate converter 42, sometimes referred to as an interpolation filter, for receiving input digital data of N1 bits at a frequency of fs. The rate converter 42 accepts input digital data at a low frequency (fs), inserts zeros at a high frequency and applies a digital filter algorithm to generate output data in N2 bits at a high frequency, such as $K_0$*fs. The single-bit sigma-delta DAC 40 further includes a digital $\Sigma$-$\Delta$ modulator 44 for converting the rate-converted signal to a high speed bit stream. A 1-bit DAC 46 receives the 1-bit data stream from the modulator 44 and generates an analog signal having two levels. The analog signal is then filtered by an anti-aliasing filter 48 to generate the final analog output signal. Because of the high oversampling frequency $K_0*fs$ used, the complexity of the anti-aliasing filter is much reduced, making it less costly and more practical in implementation.

In many cases, the $\Sigma$-$\Delta$ modulator 44 can be implemented using a second-order noise-shaping filter because of its intrinsic stability and relative simplicity. However, to ensure adequate accuracy, the input digital signal must be oversampled by a significant factor (for instance $K_0=32$ or 64), which raises dramatically the frequency of operation in sigma-delta DACs.

Figure 4:
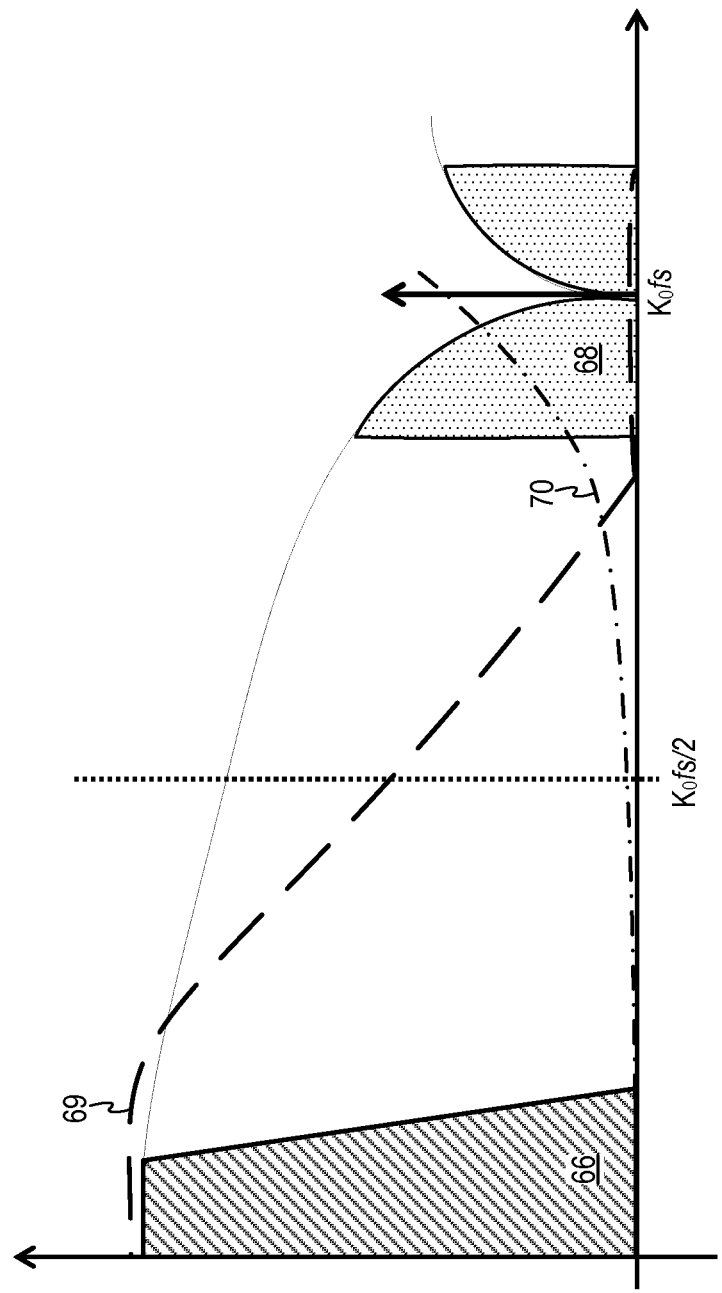
FIG. 4 illustrates the frequency spectrum of the unfiltered DAC output signal for the sigma-delta DACs of FIGS. 2(b) and 2(c).

Single-bit sigma-delta converters by their nature generate a lot of noise, but the noise is shaped at much higher frequencies than the aliasing of a Nyquist-rate DAC. FIG. 4 illustrates the frequency spectrum of the unfiltered DAC output signal for the single-bit sigma-delta DAC of FIG. 2(b) as well as the multi-bit sigma-delta DAC of FIG. 2(c) to be described. With the digital data being oversampled to $K_0fs$, the quantization noise 70 is also pushed out to the oversampled frequency, which might be 32 or 64 times higher than the Nyquist-rate data converter. This noise 70, much like the replica of a Nyquist-rate data converter, needs to be filtered out to prevent the noise from being folded back into the signal in subsequent ADC operations. However, the complexity of the filter is greatly reduced by the fact that the oversampled frequency is much higher than the useful signal bandwidth 66 and the requirement for the filter response 69 of the anti-aliasing filter can be much relaxed, without requiring a steep transition between the pass-band and cut-band.

However, if the desired output signal bandwidth is high (5-30 MHz), it might be difficult using a single-bit sigma-delta DAC to get the desired in-band signal-to-noise ratio (SNR) and to completely filter the out-of-band noise to prevent further aliasing. For instance, the required oversampling frequency could be in excess of 1 GHz and calculating the digital samples at this speed and filtering the very high quantization noise becomes challenging.

When higher in-band SNR is desired, the multi-bit sigma-delta DAC 50 shown in FIG. 2(c) can be used. Referring to FIG. 2(c), the multi-bit sigma-delta DAC 50 includes a rate converter 52 to oversample N1 bits of input digital data at a frequency of fs to a high frequency ($K_0fs$). The oversampled digital data is then provided to a multi-bit digital $\Sigma$-$\Delta$ modulator 54 which generates an output bit stream in P states (typically 3 to 8 states) at the oversampled frequency $K_0fs$. The P-state output bit stream is then provided to a P-state DAC 56 to be converted to an analog signal having P levels. The analog signal is then filtered by an anti-aliasing filter 58 to generate the final analog output signal. Similar to the case of the single-bit sigma-delta DAC, the requirement for the anti-aliasing filter is much relaxed, allowing for less complex and less costly filter circuits to be used.

The multi-bit sigma-delta DAC 50 is capable of reducing the quantization noise and increasing the achievable SNR, at the cost of slightly more complicated analog circuits. More specifically, a 1-bit sigma-delta DAC is typically implemented using a single switched current source. In the case of the multi-bit sigma-delta DAC with P output states, where P>2, (P−1) switched current sources are typically required. On the other hand, in the multi-bit sigma-delta DAC, the out-of-band quantization noise is reduced by a factor P−1, which significantly relaxes the requirements for the analog anti-aliasing filter.

However, a drawback of the multi-bit sigma-delta DAC is that it requires digital computations at the oversampled frequency which can be a speed of hundreds of MHz or GHz in the rate converter and sigma-delta modulator. The hardware implementation of these logic functions can be challenging at such a high speed. The rate conversion operation depends only on the input digital signal which can easily be parallelized and run at a lower frequency. However, the operation of the sigma-delta modulator depends on its previous output values and unrolling the computation loop to allow parallelization comes at an exponential cost with the reduction of the required computation speed k and of the number of output states of the $\Sigma$-$\Delta$ modulator, typically as $(P^k-1)/(P-1)$.

Hybrid-Architecture DAC

Figure 5:
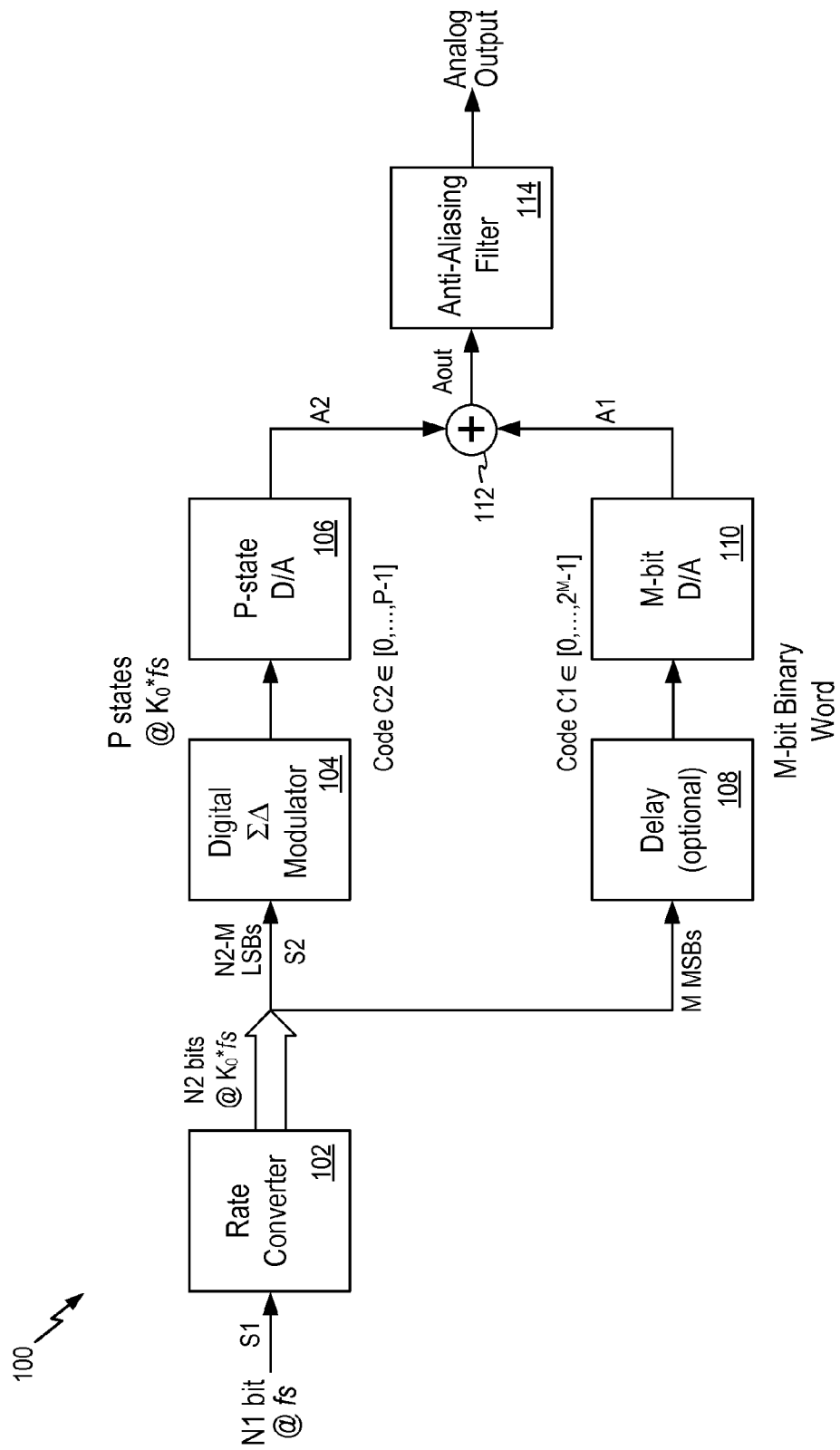
FIG. 5 is a schematic diagram illustrating a hybrid-architecture DAC according to one embodiment of the present invention.

According to embodiments of the present invention, a hybrid-architecture DAC implements an oversampling of the input digital data and uses a flash converter to convert the most significant bits and a sigma-delta converter to convert the remaining least significant bits. The hybrid-architecture DAC is constructed in a manner that the high performance DAC can be fabricated even using low-cost slower-speed fabrication process. FIG. 5 is a schematic diagram illustrating a hybrid-architecture DAC according to one embodiment of the present invention. Referring to FIG. 5, a hybrid-architecture DAC 100 includes a rate converter 102 to oversample the input digital data S1. The input digital data S1 is in N1 bits and is typically binary-weighted. The rate converter 102 receives the input digital data S1 having N1 bits at a sampling frequency of fs and converts the input signal to an output data of N2 bits oversampled by a factor of $K_0$. That is, the rate converter 102 generates the oversampled output data in N2 bits at a frequency of $K_0*fs$. In some embodiments, the oversampling factor $K_0$ is 2 to 4. In embodiments of the present invention, N2 may be equal to or less than N1. In some embodiments, an oversampled output data may have N2 bits less than N1 bits. In this case, a lower resolution output from the data converter can be tolerated because the quantization noise is spread over a higher noise bandwidth and the signal resolution in-band is still the same due to the oversampled frequency.

In one embodiment, the rate converter 102 is designed with a frequency response that filters out the replica of the input digital signal at multiples of the sampling frequency fs. In other embodiments, noise filtering can be provided downstream by the anti-aliasing filter and the rate converter does not need to provide the noise filtering. The desired filtering can also be a combination of both the response of the anti-aliasing filter and of the rate converter.

In the hybrid-architecture DAC 100, the oversampled output data from the rate converter 102 is split into M Most Significant Bits (MSBs) and N2-M Least Significant Bits (LSBs). The M MSBs are coupled to an M-bit binary-weighted DAC 110 which is implemented as a flash converter in one embodiment. Meanwhile, the N2-M LSBs are coupled to a sigma-delta ($\Sigma$-$\Delta$) converter including a digital sigma-delta ($\Sigma$-$\Delta$) modulator 104 generating an output stream with P states and a DAC 106 converting these P states into an analog signal with P output levels. P-state DAC 106 may be implemented as a thermometric flash converter in one embodiment.

The M-bit DAC 110 in the MSB signal path generates a first analog signal A1 corresponding to code C1$\in$ [0, . . . , $2^M-1$]. Meanwhile, the P-state DAC 106 in the LSB signal path generates a second analog signal A2 corresponding to code C2$\in$ [0, . . . , P−1]. The two analog signals A1 and A2 are combined by a combiner 112, such as by adding the two analog signals, to generate an analog output signal Aout indicative of the input digital data. The analog output signal Aout is then filtered by an anti-aliasing filter 114 to generate the final filtered analog output signal. Because of the oversampling of the input digital data, the filter response requirements on the anti-aliasing filter 114 are relaxed and the anti-aliasing filter 114 can be implemented with reduced complexity. Because of the oversampled frequency, any clock leakage is also pushed to a high frequency, making it easier to filter out any clock leakage. Furthermore, the same filter 114 may be used for a variety of signals having low bandwidth or large bandwidth.

In some embodiments, the size of the output resolutions (corresponding to one LSB) of DACs 110 and 106 can be different. However, choosing the resolutions of the two converter to be identical allow for the simplest implementation.

In some embodiments, an optional delay circuit 108 may be included in the MSB signal path to provide a matching delay so as to equalize the signal propagation times in the MSB signal path and the LSB signal path. The second analog signal A2 processed in the LSB signal path may be delayed due to the filtering function of the $\Sigma$-$\Delta$ modulator 104 so that the second analog signal A2 may not be in phase with the first analog signal A1 at the data combiner 112. Such phase delay can introduce overall response distortion at high frequency. In some cases, because the oversampling factor $K_O$ is large, the distortion effect can be neglected. However, any degradation due to distortion can be minimized by introducing a matching delay 108 in the MSB signal path.

In operation, if the input digital signal S1 is normalized to the range of [0 . . . 1[ such that $0 \leq S1 \leq 1$, where S1 has a fractional binary representation of N1 bits after the decimal point, i.e. S1 can be represented by the fractional number $(0.a_0 a_1 a_2 a_3 \ldots a_{N1-1})$ in base 2, the analog signal A1 of the M-bit DAC 110 in the MSB signal path at a time index i is then given as: $C1(i) = \text{floor}(2^M * S1(i))$.

Meanwhile, if the digital input signal S2 provided as input to the $\Sigma$-$\Delta$ modulator 104 is renormalized to the range of [0 . . . 1[ such that $0 \leq S2 < 1$, where S2 has a fractional binary representation of N2−M bits after the decimal point, the digital input signal S2 at a time instant is given as: $S2(i) = (2^M) * S1(i) - C1(i)$.

$\Sigma$-$\Delta$ converters perform poorly when the input signal is close to the minimum or maximum boundaries of the conversion range. Thus, using a single-bit sigma-delta converter on the digital input signal S2 would provide poor performance results as $(2^M) * S1$ is close to an integer.

According to embodiments of the present invention, the $\Sigma$-$\Delta$ modulator in the LSB signal path for converting the N2-M LSBs is implemented as a $\Sigma$-$\Delta$ modulator with an output data range larger than the normalized input data range of [0 . . . 1[ of the digital input signal S2. In some embodiments, the $\Sigma$-$\Delta$ modulator 104 has an output data range at least twice larger than the normalized input data range. In some embodiments, the $\Sigma$-$\Delta$ modulator has an output data range of [−0.5, 1.5[. In embodiments of the present invention, the extended output data range is realized using a single-bit $\Sigma$-$\Delta$ modulator having an output weight of 2 relative to the least significant bit of the M MSBs. Thus, the single-bit $\Sigma$-$\Delta$ modulator has two states corresponding to two outputs of weight −0.5 and 1.5, respectively. However, when the output step size is doubled by doubling the output weight, the quantization noise is also doubled.

In other embodiments, the extended output data range is realized using a multi-bit $\Sigma$-$\Delta$ modulator with three or more output states which has the benefits of reducing the quantization noise. In one embodiment, a 1.5-bit $\Sigma$-$\Delta$ modulator is used, with P=3 output states corresponding to the output levels −0.5, 0.5 and 1.5 associated with output codes C2 of 0, 1 and 2. In this manner, the digital input signal S2 provided to the $\Sigma$-$\Delta$ modulator 104 has an input data range of [0 . . . 1[ which is within the output data range [−0.5, 1.5[ of the 1.5-bit $\Sigma$-$\Delta$ modulator. Thus, the $\Sigma$-$\Delta$ modulator is ensured not to have to handle input data that are close to the minimum or maximum boundaries of the conversion range and the performance of the $\Sigma$-$\Delta$ modulator is enhanced.

In embodiments of the present invention, the $\Sigma$-$\Delta$ modulator 104 can be implemented using any type of noise shaping filter functions. In some embodiments, the $\Sigma$-$\Delta$ modulator 104 is implemented using a second order noise shaping filter with simple implementation in terms of the number of arithmetic functions. In one embodiment, the $\Sigma$-$\Delta$ modulator 104 is implemented using a second order noise shaping filter function given by the recursive algorithm as follows:

$$A(i) = S2(i) + 2*E(i-1) - E(i-2),$$

where:
    C2(i)=0 when A(i)<0
    C2(i)=1 when 0>=A(i)>1
    C2(i)=2 when A(i)>2
    E(i)=A(i)−C2(i)+0.5, where A(i) is the $\Sigma$-$\Delta$ accumulator at instant i, E(i) is the quantization error and C2(i) is the output code of the $\Sigma$-$\Delta$ modulator. By using the second order noise shaping filter function, and by limiting the number of output states to only 3, the $\Sigma$-$\Delta$ modulator 104 may implement unrolling and parallelization at a reasonable cost to speed up the computation without requiring a high speed fabrication process.

In the present embodiment, the normalized input signal S1 is approximately represented (within the quantization error) by $S1 \approx (C1 + C2 - 0.5)/2^M$. So S1 has a constant additive offset of $0.5/2^M$ relative to the sum of output codes C1 and C2. This offset is typically not detrimental and naturally disappears when a differential implementation of the DAC is chosen.

Figure 6:
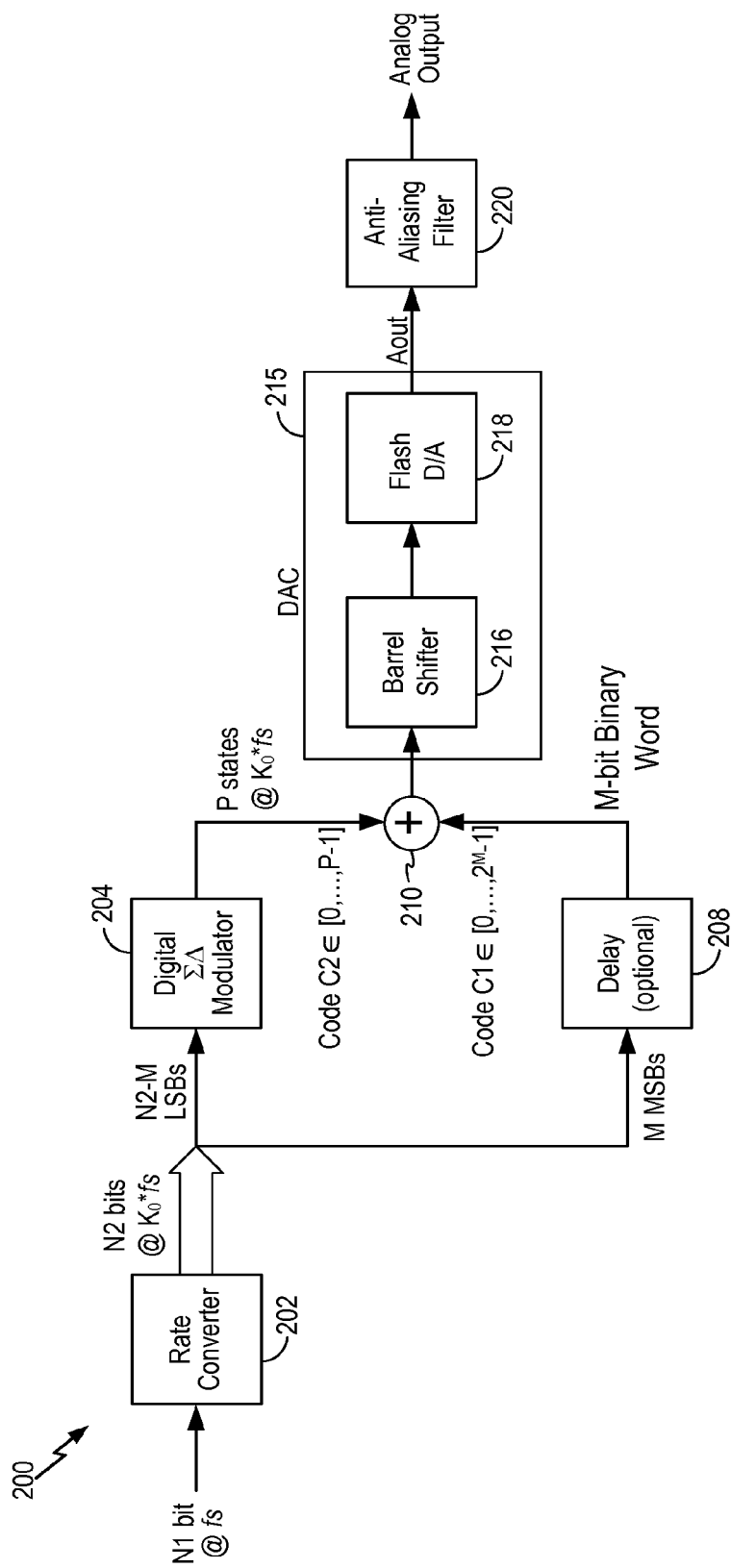
FIG. 6 is a schematic diagram illustrating a hybrid-architecture DAC according to an alternate embodiment of the present invention.

FIG. 6 is a schematic diagram illustrating a hybrid-architecture DAC according to an alternate embodiment of the present invention. Referring to FIG. 6, a hybrid-architecture DAC 200 is constructed in a similar manner as the hybrid-architecture DAC 100 of FIG. 5 and includes a rate converter 202 to oversample the input digital data, a flash converter to convert the most significant bits and a sigma-delta converter to convert the remaining least significant bits. However, in the hybrid-architecture DAC 200, the flash converter of the MSB and the DAC of the sigma-delta converter are merged to realize further performance improvements.

More specifically, after the rate converter 202, the oversampled output data are split into M MSBs and N2−M LSBs. The M MSBs are provided through an optional delay circuit 208 to a data combiner 210. Meanwhile, the N2−M LSBs are provided to a digital sigma-delta modulator 204 to be processed. The $\Sigma$-$\Delta$ modulator 204 generates a digital bit stream corresponding to P possible output states as the output signal. In one embodiment, the $\Sigma$-$\Delta$ modulator 204 is a 1.5-bit $\Sigma$-$\Delta$ modulator and generates the digital output stream having three output levels—0, 1, and 2. The digital bit stream from the $\Sigma$-$\Delta$ modulator 204 is also provided to the data combiner 210. Data combiner 210 recombines the data bits from the MSB signal path (M MSBs) and the P-states bit stream from the $\Sigma$-$\Delta$ modulator 204. In one embodiment, the data combiner 210 is an adder adding code C1$\epsilon$ [0, . . . , $2^M-1$] representing the M MSBs and code C2$\epsilon$ [0, . . . , P−1] representing the P-state output of the $\Sigma$-$\Delta$ modulator.

In some embodiments, a delay circuit 208 providing a delay matching the delay through the sigma-delta modulator 204 may be included in the MSB signal path so that signals arriving at the data combiner 210 are in phase with each other.

The data combiner 210 recombines the P-states data bit stream and the M MSB data bits. The combined data bits are then provided to a merged DAC 215 to be converted to an analog output signal Aout. The analog output signal is then provided to an anti-aliasing filter 220 to generate the final filtered analog output signal.

In embodiments of the present invention, the DAC 215 is implemented as a flash converter 218 using a bank of switched current sources. To eliminate mismatch errors between the bank of switched current sources, dynamic element matching or mismatch shaping techniques may be applied in embodiments of the present invention. In the present embodiment, a barrel shifting technique is employed to rotate the current sources between the data bits to even out any mismatch errors. To that end, the DAC 215 includes a barrel shifter 216 before the flash converter 218 configured to rotate the combined data bits among the switched current sources to eliminate mismatch errors. In embodiments of the present invention, the DAC 215 is implemented using identical switched current sources. Therefore, the barrel shifter 216 performs a binary to thermometric code conversion on the combined data bits. The thermometric-converted data bits are then applied to control the switched current sources in rotation in accordance with well-known barrel shifting techniques.

Figure 7:
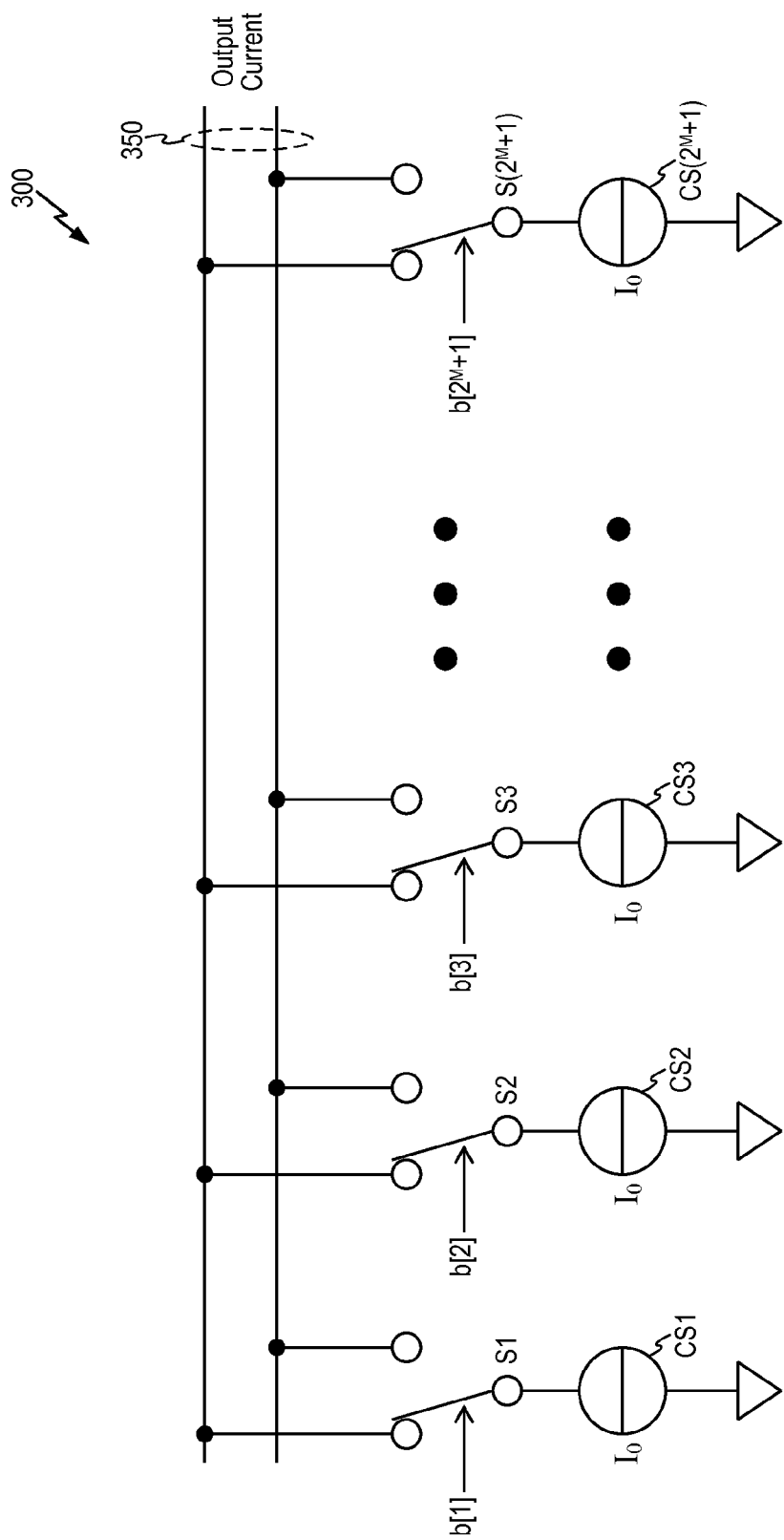
FIG. 7 is a schematic diagram illustrating a flash DAC which can be incorporated in the hybrid-architecture DAC of FIG. 6 according to embodiments of the present invention.

FIG. 7 is a schematic diagram illustrating a flash converter which can be incorporated in the hybrid-architecture DAC of FIG. 6 according to embodiments of the present invention. Referring to FIG. 7, a flash converter 300 providing a differential output current is implemented using a bank of switched current sources. That is, a bank of Q current sources CS1 to CSQ are arranged in parallel and each current source is switchably connected to the output current node 350 through a respective switch S1 to SQ. In the present embodiment, the current sources CS1 to CSQ are identical current sources. Switches S1 to SQ are controlled by data bits $b[1]$ to $b[q]$ which are the combined data bits generated at data combiner 210 after binary-to-thermometric conversion. Depending on the values of the combined data bits, one or more current sources CS1 to CSQ will be turned on to supply output current to the differential output current node 350 to generate the desired output signal. The differential output current can be converted to a single-ended current, or to a differential or single-ended voltage as the output signal of the flash converter.

In general, the flash converter is implemented using $2^M+P-2$ current sources. That is, $Q=2^M+P-2$. In embodiments of the present invention, the $\Sigma$-$\Delta$ modulator 204 is a 1.5-bit $\Sigma$-$\Delta$ modulator with P=3. In that case, the data combiner 210 provides $2^M+1$ data bits and the flash converter is implemented using $2^M+1$ identical switched current sources CS1 to CS($2^M+1$), as shown in FIG. 7. The current sources CS1 to CS($2^M+1$) are switchably connected to the differential output current node 350 through switches S1 to S($2^M+1$). For instance, when three MSBs are used (M=3), the flash converter requires 7 current sources for the 3 MSB data bits and 2 current sources for the 1.5 bits from the $\Sigma$-$\Delta$ modulator. Thus, a total of $2^M+1$ or 9 switched current sources are employed.

At a given time instant i, the data bits $b[1]$ to $b[2^M+1]$ will turn on a given number of current sources to direct the currents from the "switched-on" current sources to one side of the differential output current node 350 while the currents from the "switched-off" current sources are directed to the other side of the differential output current node 350. In this manner, a differential output current is generated having a current value as a function of the combined data bits $b[1]$ to $b[2^M+1]$.

In embodiments of the present invention, the barrel shifter 216 is employed to rotate the assignment of the data bits $b[1]$ to $b[2^M+1]$ to the switched current sources CS1 to CS($2^M+1$). That is, at each rotation, a different one of the data bits is coupled to control switches S1 to S($2^M+1$) so that the data bits rotate around the current sources even if the output codes C1 and C2 are constant. In this manner, distortion caused by mismatches between the $2^M+1$ identical current sources can be eliminated.

In one embodiment, the barrel shifter is configured to rotate among the current sources by shifting one current source at a time. That is, at time instant i, current sources CS1, CS2 and CS3 may be turned on. Then at time instant i+1, current sources CS2, CS3 and CS4 may be turned on. In other embodiments, the barrel shifter is configured to rotate among the current sources by shifting a group of current sources at a time. That is, at time instant i, current sources CS1, CS2 and CS3 may be turned on. Then at time instant i+1, current sources CS4, CS5 and CS6 may be turned on. That is, at time instant i+1, the first current source to be turned on is the one following the last current source turned on at time instant i.

The hybrid-architecture DAC 200 of FIG. 6 using an integrated DAC to convert the MSB and sigma-delta processed LSB realizes enhanced performance by sharing the flash converter for all of the data bits so that current mismatch errors in the flash converter can be eliminated.

In other embodiments of the present invention, the DAC 215 may be implemented as a flash converter using switched current sources having different weights, or the DAC 215 may be implemented as a flash converter using switched current sources having the same weights with two or more current sources representing a data bit in the combined data bits. The exact implementation of the DAC 215 is not critical to the practice of the present invention and different DAC schemes, presently known or to be developed, may be used.

Furthermore, several barrel shifting schemes have been described above which can be incorporated in the DAC 215 implemented with identical switched current sources to eliminate mismatch errors. The use of a barrel shifter in DAC 215 is optional and may be omitted in other embodiments of the present invention, particularly when mismatch errors do not pose a significant problem. Alternately, other barrel shifting schemes may be used. The exact implementation of the barrel shifter 216 is not critical to the practice of the present invention and different barrel shifting schemes, presently known or to be developed, may be used.

Advantages

The hybrid-architecture DAC of the present invention realizes many advantages over conventional DAC architectures. First, the hybrid-architecture DAC simplifies the analog implementation of the DAC since the analog section of a circuit is harder to migrate to a new generation of integrated circuit technology or a new fabrication process. On the other hand, porting digital code to a new fabrication process is much more straightforward. Digital implementations benefit fully from smaller geometry processes (size and power consumption), whereas analog circuit scale generally poorly. Therefore, it is advantageous to maximize digital processing and minimize analog processing. The hybrid-architecture DAC of the present invention presents a very small analog footprint.

The hybrid-architecture DAC of the present invention realizes tradeoffs between various techniques and allows a fairly wideband sigma-delta DAC to be manufactured in a fabrication process that is not necessarily high speed.

The hybrid-architecture DAC of the present invention allows the receiver DAC to be connected directly to a decoder ADC operating at any sampling frequency without suffering from folding effects. The hybrid-architecture DAC reduces the quantization noise to reduce the constraint on the anti-aliasing filter.

The hybrid-architecture DAC of the present invention reaps the advantages of a multi-bit sigma-delta modulator while still enables unrolling and parallelization at a reasonable cost.

The hybrid-architecture DAC of the present invention is well suited to output narrower-band signals, such as either terrestrial or cable TV signals, on one hand and wider-band signals, such as satellite signals, on the other hand. The nature of the sigma-delta modulators is that the DAC may be operated to trade in a higher bandwidth against a lower SNR (e.g., satellite requires a lower SNR).

The hybrid-architecture DAC of the present invention can be implemented using a sampling frequency out of the TV signal band (0-1 GHz) to prevent the creation of spurs at a multiple of the sampling frequency that might disturb the TV signals.

The above detailed descriptions are provided to illustrate specific embodiments of the present invention and are not intended to be limiting. Numerous modifications and variations within the scope of the present invention are possible. The present invention is defined by the appended claims.

We claim:

1. A digital-to-analog converter (DAC) circuit receiving an N1-bit digital input data at a first sampling frequency and generating an analog output signal indicative of the digital input data, the DAC circuit comprising:
   a rate converter configured to receive the N1-bit digital input data and to generate an oversampled output data in N2 bits at an oversampled frequency being K times the first sampling frequency;
   a first converter configured to receive M most significant bits (MSBs) of the oversampled output data and to generate a first analog signal indicative of the M MSBs of the oversampled output data;
   a sigma-delta converter configured to receive N2-M least significant bits (LSBs) of the oversampled output data and to generate a second analog signal indicative of the N2-M LSBs of the oversampled output data;
   a data combiner configured to combine the first and second analog signals and to generate a third analog signal; and
   an anti-aliasing filter configured to filter the third analog signal to generate a filtered analog output signal as the analog output signal of the DAC circuit.

2. The DAC circuit of claim 1, wherein N2 is less than N1.

3. The DAC circuit of claim 1, wherein the N1-bit digital input data comprises an N1-bit binary-weighted digital input data and the first converter comprises a binary-weighted flash converter.

4. The DAC circuit of claim 1, wherein the sigma-delta converter comprises a sigma-delta modulator configured to process the N2-M LSBs into a P-states digital bit stream, P being 2 or more, and a second converter configured to receive the P-states digital bit stream and to generate the second analog signal.

5. The DAC circuit of claim 4, wherein the second converter comprises a thermometric flash converter.

6. The DAC circuit of claim 4, wherein the N2-M LSBs has an input range of a first value and the sigma-delta modulator comprises a sigma-delta modulator having an output range of a second value, the second value being greater than the first value.

7. The DAC circuit of claim 6, wherein the sigma-delta modulator comprises a single-bit sigma-delta modulator with P=2 and two output levels and with an output weight being a multiple of the least significant bit of the M MSBs to extend the output range to be greater than the input range.

8. The DAC circuit of claim 6, wherein the sigma-delta modulator comprises a multi-bit sigma-delta modulator where P is 3 or more and the sigma-delta modulator is configured to generate the digital bit stream having three or more states corresponding to three or more output levels.

9. The DAC circuit of claim 8, wherein the sigma-delta modulator comprises a 1.5-bit sigma-delta modulator configured to generate the digital bit stream having three states (P=3) and three output levels.

10. The DAC circuit of claim 4, wherein the sigma-delta modulator implements a second order noise shaping filter.

11. The DAC circuit of claim 4, further comprising a delay circuit configured to receive the M MSBs of the oversampled output data and to introduce a delay to the M MSBs before providing the delayed M MSBs to the first converter, the delay provided by the delay circuit matching a signal propagation delay through the sigma-delta modulator.

12. A digital-to-analog converter (DAC) circuit receiving an N1-bit digital input data at a first sampling frequency and generating an analog output signal indicative of the digital input data, the DAC circuit comprising:
   a rate converter configured to receive the N1-bit digital input data and to generate an oversampled output data in N2 bits at an oversampled frequency being K times the first sampling frequency;
   a sigma-delta modulator configured to receive N2-M least significant bits (LSBs) of the oversampled output data and to process the N2-M LSBs into a P-state digital bit stream, P being 2 or more;
   a data combiner configured to receive and combine M most significant bits (MSBs) of the oversampled output data and the P-states digital bit stream into a set of combined data bits;
   a converter configured to receive the set of combined data bits and to generate a first analog signal; and
   an anti-aliasing filter configured to filter the first analog signal to generate a filtered analog output signal as the analog output signal of the DAC circuit.

13. The DAC circuit of claim 12, wherein N2 is less than N1.

14. The DAC circuit of claim 12, wherein the N2-M LSBs has an input range of a first value and the sigma-delta modulator comprises a sigma-delta modulator having an output range of a second value, the second value greater than the first value.

15. The DAC circuit of claim 14, wherein the sigma-delta modulator comprises a single-bit sigma-delta modulator with P=2 and two output levels and with an output weight being a multiple of the least significant bit of the M MSBs to extend the output range to be greater than the input range.

16. The DAC circuit of claim 14, wherein the sigma-delta modulator comprises a multi-bit sigma-delta modulator where P is 3 or more and the sigma-delta modulator is configured to generate the digital bit stream having three or more states corresponding to three or more output levels.

17. The DAC circuit of claim 16, wherein the sigma-delta modulator comprises a 1.5-bit sigma-delta modulator configured to generate the digital bit stream having three states (P=3) and three output levels.

18. The DAC circuit of claim 12, wherein the sigma-delta modulator implements a second order noise shaping filter.

19. The DAC circuit of claim 12, further comprising a delay circuit configured to receive the M MSBs of the oversampled output data and to introduce a delay to the M MSBs before providing the delayed M MSBs to the first converter, the delay provided by the delay circuit matching a signal propagation delay through the sigma-delta modulator.

20. The DAC circuit of claim 12, wherein the converter comprises a thermometric flash converter.

21. The DAC circuit of claim 20, wherein the flash converter comprises a bank of switched current sources having identical current values, the switched current sources being controlled by the set of combined data bits to supply currents to an output node, the sum of the currents at the output node being indicative of the first analog signal.

22. The DAC circuit of claim 20, wherein the set of combined data bits are in binary form and are converted to thermometric codes, the thermometric-code-converted data bits being used to control the bank of switched current sources.

23. The DAC circuit of claim 22, further comprises a barrel shifter configured to receive the set of combined data bits in binary form, the barrel shifter being configured to convert the combined data bits to thermometric codes and to apply the thermometric-code-converted data bits in rotation to each of the switched current sources.

* * * * *